US007447052B1

United States Patent
Maheshwari

(10) Patent No.: US 7,447,052 B1
(45) Date of Patent: Nov. 4, 2008

(54) METHOD AND DEVICE FOR LIMITING CURRENT RATE CHANGES IN BLOCK SELECTABLE SEARCH ENGINE

(75) Inventor: Dinesh Maheshwari, Fremont, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 230 days.

(21) Appl. No.: 11/499,021

(22) Filed: Aug. 4, 2006

Related U.S. Application Data

(60) Provisional application No. 60/705,974, filed on Aug. 4, 2005.

(51) Int. Cl.
*G11C 15/00* (2006.01)
(52) U.S. Cl. .................................. 365/49; 711/206
(58) Field of Classification Search ............. 365/49; 711/206, 202
See application file for complete search history.

(56) References Cited

U.S. PATENT DOCUMENTS

| | | | |
|---|---|---|---|
| 6,240,000 B1 | 5/2001 | Sywyk et al. | |
| 6,370,613 B1 | 4/2002 | Diede et al. | |
| 6,515,884 B1 | 2/2003 | Sywyk et al. | |
| 6,763,425 B1 | 7/2004 | Pereira | |
| 6,763,426 B1 | 7/2004 | James et al. | |
| 6,958,925 B1 | 10/2005 | Om et al. | |
| 7,099,170 B1 | 8/2006 | Narum et al. | |
| 7,120,733 B1 * | 10/2006 | Mick et al. ............... | 711/108 |
| 2003/0208475 A1 * | 11/2003 | Andreev et al. .......... | 707/3 |
| 2003/0235099 A1 | 12/2003 | Mori et al. | |

OTHER PUBLICATIONS

U.S. Appl. No. 11/085,399, Om, Harl.

* cited by examiner

*Primary Examiner*—Son Dinh
(74) *Attorney, Agent, or Firm*—Haverstock & Owens, LLP

(57) ABSTRACT

A search engine system can include at least one command decoder having search engine command input and at least one pipeline for propagating command data from the command decoder from a pipeline input to a pipeline output. The command data can be directed to targeted portions of a plurality of searchable entries. At least one current control circuit can issue dummy command data that bypasses the pipeline and activates non-targeted portions of the searchable entries.

20 Claims, 4 Drawing Sheets

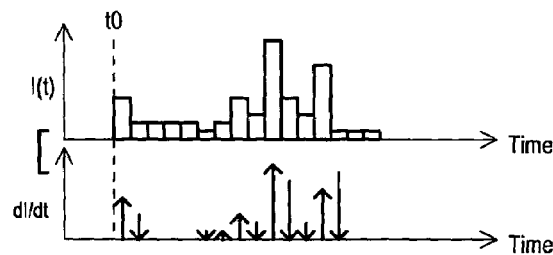
FIG. 1A (CONVENTIONAL)
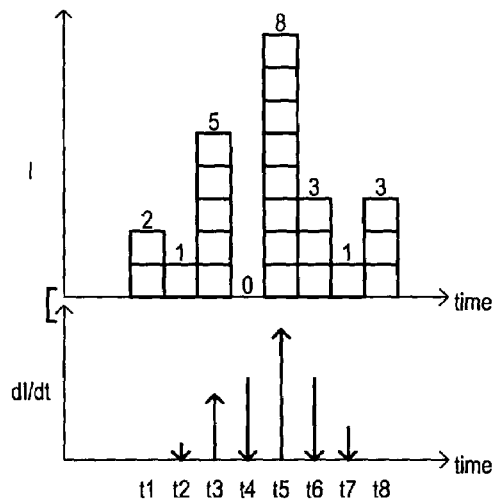
FIG. 2A (CONVENTIONAL)

|    | $I_0$ | n1 term | n2 term | n3 term | n4 term | n5 term | n6 term | n7 term | n8 term | $I_F$ | $I_{APP}$ |
|----|---|---|---|---|---|---|---|---|---|---|---|
| t1 | 4 | -2/1 | -3/2 | -1/3 | -4/4 | (4/5) | -1/6 | -3/7 | -1/8 | 2 | 5 |
| t2 | 4 |      | -3/1 | -1/2 | -4/3 | (4/4) | -1/5 | -3/6 | -1/7 | 2 | 5 |
| t3 | 4 |      |      | -1/1 | -4/2 | (4/3) | -1/4 | -3/5 | -1/6 | 2 | 5 |
| t4 | 4 |      |      |      | -4/1 | (4/2) | -1/3 | -3/4 | -1/5 | 2 | 6 |
| t5 | 4 |      |      |      |      | (4/1) | -1/2 | -3/3 | -1/4 | 2 | 8 |
| t6 | 4 |      |      |      |      |      | -1/1 | -3/2 | (-1/3) | 2 | 4 |
| t7 | 4 |      |      |      |      |      |      | -3/1 | (-1/2) | 2 | 4 |
| t8 | 4 |      |      |      |      |      |      |      | -1/1 | (2) | 3 |

| OPERATION | RAMP RATE |
|---|---|
| NOP | 2 |
| READ | 1 |
| WRITE | 1 |
| SEARCH | 0.5 |

US 7,447,052 B1

METHOD AND DEVICE FOR LIMITING CURRENT RATE CHANGES IN BLOCK SELECTABLE SEARCH ENGINE

This application claims the benefit of U.S. Provisional Patent Application No. 60/705,974, filed Aug. 4, 2005, the contents of which are incorporated by reference herein.

TECHNICAL FIELD

The present invention relates generally to search engine devices having multiple blocks, and more particularly, to search engine systems that can select subsets of all blocks for a given search operation.

BACKGROUND OF THE INVENTION

Content addressable memory (CAM) devices, sometimes also referred to as "associative memories", can provide rapid matching functions between an applied data value (e.g., a comparand, compare data, or search key) and stored data values (e.g., entries). Such rapid matching functions are often utilized in routers, network switches, and the like, to process network packets.

In a conventional CAM device, search operations can be conducted in response to a system clock, with searches being undertaken every clock cycle. As a result, CAM devices can draw considerable current as match lines and/or compare data lines in the CAM cell array are continuously charged and discharged each clock cycle.

One way to address current draw of a CAM device can be to stagger search operations. Two conventional approaches are shown in U.S. Pat. No. 6,240,000 issued to Sywyk et al. on May 29, 2001 and U.S. Pat. No. 6,958,925 issued to Om et al. on Oct. 25, 2005.

Current draw in a CAM device can be problematic in the case of a "cold start" operation. A cold start operation can occur when a CAM device switches from an idle state, in which the various CAM array sections of the device are not operational, to an active state, in which CAM array sections perform various functions, such as a search operation, or the like. Existing conventional approaches can transition from an idle state to a full active state (e.g., search) in a single cycle. This can potentially happen on every other cycle. When a CAM device portion (e.g., a core, array, or block) goes from an idle to an active operation, there can be a very large change in the current requirement for the device. Such a current surge may be too large for the on-chip capacitance to support and can happen too quickly for capacitors on circuit boards associated with the CAM device.

Still further, parasitic inductance of a package containing a CAM device, as well as inductance inherent in a CAM device mounting arrangement, can prevent a fast ramp up of the current, preventing an adequate current supply from being provided when needed by the CAM device.

The above deficiencies can result in a power supply voltage "sag" (i.e., level dip) within the CAM device. In addition, the rapid change in current (dI/dt) through parasitic inductive elements can give rise to ground "bounce" (transient jump in a low supply voltage level), which can further disturb CAM operations. These undesirable variations in supply voltages can adversely impact performance, and are often referred to as "cold start" failures or problems.

Still further, newer generation CAM devices can have the capability of directing searches to selected blocks within a CAM device. In such applications, the current draw requirement between different searches can be considerable, as one search could potentially search one block while a subsequent search could search all blocks. Such applications can have the same essential problems as a cold start case, having to accommodate substantial current rate changes (dI/dt).

Another approach to limiting current surges includes changing search key bits every cycle to thereby control dI/dt changes during idle cycles. Such an approach may not be effective in the case of dynamic variations in search block numbers, as current draw may be less dependent upon actual bit values, and far more dependent upon power consumed by match sense amplifiers (MSAs) within a CAM. Still further, varying search key bit values does not address non-search operations, such a read/write operations. Read/write operations may be more significant power source draws than idle operations.

Another way to address such current surges can be to issue dummy commands to maintain a minimum current draw level (floor). Such techniques are disclosed in commonly-owned copending U.S. patent application Ser. No. 11/014,123, titled METHOD AND APPARATUS FOR SMOOTHING CURRENT TRANSIENTS IN A CONTENT ADDRESSABLE MEMORY (CAM) DEVICE WITH DUMMY SEARCHES, by Om et al., filed Dec. 15, 2004, now U.S. Pat. No. 7,149,101 issued on Dec. 12, 2006, and Ser. No. 11/085,399, titled METHOD AND APPARATUS FOR SMOOTHING CURRENT TRANSIENTS IN A CONTENT ADDRESSABLE MEMORY (CAM) DEVICE, by Hari Om, filed on Mar. 21, 2005, now U.S. Pat. No. 7,277,982 issued on Oct. 2, 2007. Dummy commands can raise a current floor to thereby reduce the overall dI/dt between searches.

Staggering compare operations can reduce current surges, but can introduce latency into a compare operation. In addition, activation of overall global wiring may result in some additional power consumption.

Use of dummy searches can be particularly valuable when ramping up and down from start and idle states, but may not fully address searches on block numbers that can vary dynamically.

To better understand various features of the disclosed embodiments, a conventional approaches to utilizing dummy searches will now be described.

FIG. 8 shows a search engine system 800 having a decode circuit 802 and a current control circuit 804. According to decoded functions from decoder circuit 802, current control circuit 804 can initiate dummy searches from decode circuit 802. Searches, both regular (i.e., those called for by the search command) and dummy can propagate through a pipeline to activate particular combinations of CAM arrays (e.g., CAM blocks) 806.

FIG. 7 includes two graphs 700 and 702. Graph 700 shows a number of CAM block activated in response to a particular sequence of instructions. Graph 702 shows the same search sequence of graph 700, but with the addition of a minimal "floor" value. That is, dummy searches are inserted to ensure that some minimal current is drawn in each cycle. As shown, while use of dummy searches can introduce a "floor" in current consumption, in the event a sequence activates a substantially larger number of CAM blocks than a floor value (shown by the arrow), a considerable change in dI/dt will result.

Thus, conventional CAM devices utilizing current "floors" are faced with competing requirements: dI/dt changes versus average power. That is, while raising a minimum floor may address some dI/dt changes, such approaches increase overall power consumption by activating more CAM blocks than necessary on most operational cycles

BRIEF DESCRIPTION OF THE DRAWINGS

FIG. 1A is a timing diagram of a conventional sequence of search engine operations.

FIGS. 2A to 2C illustrate one example of a block activation method according to one embodiment.

FIG. 3 is a table illustrating how operations can be weighted to provide operation based algorithmic adjustment of current rate changes, according to an embodiment.

FIG. 4 is a graph illustrating one example of an operation based approach to limiting current according to an embodiment.

DETAILED DESCRIPTION

The embodiments of the present invention are directed to an algorithmic approach to adjusting the current drawn by a search engine system in which operations can be directed to different numbers of blocks. The embodiments show devices and methods in which additional current draw can be introduced (through dummy searches, or the like) based on an entire sequence of operations. Thus, current draw can be ramped up or down on the expected maximum and/or minimum (or floor) current expected over the entire sequence.

The ramping up and/or down of current draw can rely on the ability to "look-ahead" in a command pipeline. The more look ahead there is in a system, the greater the ability of the embodiments to ramp current draw in anticipation, and thereby reduce overall changes in current (dI/dt). The embodiments can include various algorithmic approaches to increasing/decreasing current draw. The very particular approaches illustrated herein should not be construed as limiting to the overall invention. The approaches can include, without limitation, linear ramping approaches or non-linear ramping approaches, including operation dependent ramping.

Still further, the various embodiments can be utilized in combination with other existing methods, such as those that provide a minimum current draw during operations (i.e., a current "floor").

Figure 1B:
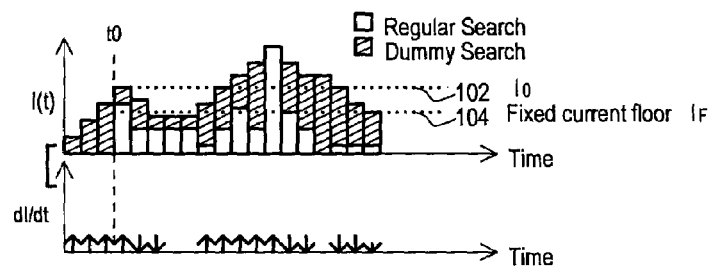
FIG. 1B is a timing diagram of a modified sequence of search engine operations generated for the sequence of FIG. 1A according to one embodiment.

FIGS. 1A and 1B show two timing diagrams of current consumed during operational cycles of a search engine system. FIG. 1A is a timing diagram of current consumption according to a conventional approach in which no dummy operations are utilized for a sequence of operations starting at time t0. FIG. 1A includes representations of current I(t), as well as current change (dI/dt). As shown, the conventional approach can result in considerable changes in current draw, as different numbers of blocks can be activated in different operational cycles.

FIG. 1B shows the same sequence of operations as FIG. 1A, but with additional current drawn according to an algorithmic approach of one embodiment. FIG. 1B shows one representation of an algorithmic approach according to the following relationships.

Current draw in a given operation is given by $n_i$. As but one example, this can represent the number of separate sections of a search engine system (e.g., content addressable memory (CAM) sub-blocks, or blocks) that are activated in response to a command.

According to such a relationship, the current drawn for a sequence of operations can be given by the following:

$$I(t)=[I(T+2,n_x) \ldots I(T1+dT,n_y)]$$

where a first operation of the sequence occurs at time "T+2" (activating $n_x$ sections) and a last operation of the sequence occurs at time "T1+dT" (activating $n_y$ sections).

A baseline current (which may be an average, mean, etc.) can be given as:

$$I_0 = \tfrac{1}{2} \ast [\text{Max}(n_0, n_1 \ldots n_p) - \text{Min}(n_0, n_1 \ldots n_p)] = I(-,n_{av})$$

Where $n_0, n_1 \ldots n_p$ represent the current draw values for a sequence of p+1 operations.

A resulting current, employing a linear ramping of current can be given by the following:

$$I(t)=\text{the Maximum of } I_0+[I(T,(n_x-n_{av})/3), I(T+1,2(n_x-n_{av})/3), I(T+2,(n_x-n_{av}))] \ldots [I(T1,(n_y-n_{av})/(p+1)) \ldots I(T1+dT-1,p\ast(n_y-n_{av})/(p+1)), (T1+dT,(n_y-n_{av}))] \text{ OR a fixed current floor } (I_F).$$

The above arrangement shows how, at any point in the sequence, sufficient current can be drawn to provide a ramp up or down to maximum or minimum levels. Also, the above example shows an arrangement that allows for a two cycle ramp up leading up to a first operational cycle (at time T and T+1). Of course an even greater number of cycles can be utilized to ramp-up a current prior to a first search of a sequence. Further, as emphasized above, ramping does not necessarily have to be linear.

It is noted that FIG. 1 shows an arrangement in which algorithmic ramping is utilized in conjunction with an imposed minimum current draw (i.e., a current "floor").

A comparison between the dI/dt waveforms of FIGS. 1A and 1B shows how the inclusion of dummy searches into each search of the sequence can considerably reduce current draw changes between searches. As shown in FIG. 1B, a baseline current 102 ($I_0$) can be calculated, and dummy searches added to provide more gradual changes in activated sections, at the same time maintaining a current floor 104 ($I_F$) throughout the sequence.

Figure 2B:
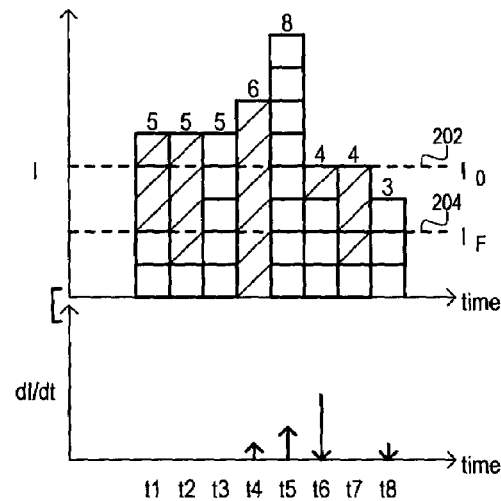
Figures 2C, 3, 4:
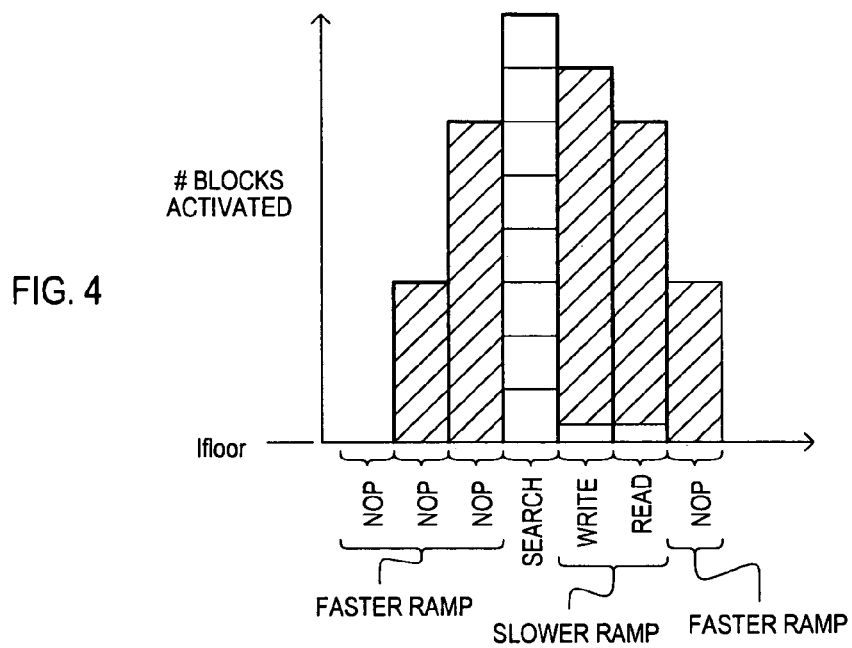

One very particular example of an algorithmic approach according to the above embodiment is shown in FIGS. 2A to 2C. The example shows a sequence of eight searches, directed to 2, 1, 5, 0, 8, 3, 1 and 3 blocks, respectively. The baseline current value 202 ($I_0$) is determined to be "4" and a current floor 204 ($I_F$) is given as "2".

FIG. 2A shows an example of a sequence according to a conventional arrangement that does not include dummy searches. FIG. 2B shows a resulting sequence modified according to one embodiment. FIG. 2C is a table illustrating the calculations utilized to arrive at the modified sequence of FIG. 2B. It is understood that the various terms (e.g., "n1 term", "n2 term") correspond to the general expression $$q/r \ast (n_y - n_{av})$$

where q ranges from 1 to r, and r ranges from 0 to p.

It is understood that the above embodiments have presented a linear ramping approach that divides a current block activation difference (e.g., $n_y - n_{av}$) according to position in the sequence (e.g., $1/(p+1)$ to $(p+1)/(p+1)$). However, the present invention should not be limited to such a linear approach. As but one example, current ramping can be based on position in the sequence, with ramp rates being faster in earlier cycles, and slower in later cycles, or ramp rates being based on type of operation.

One very particular example of operation based ramping is shown in FIGS. 3 and 4. FIG. 3 is a table showing how a ramp rate can be adjusted according to type of operation. Such an arrangement can allow large ramp rates for operations that are less sensitive to changes in current. As but one example, an algorithm can weight operations for a given time period based on the operation taking place in the time period.

In the very particular example of FIG. 3, a largest ramp rate can be allowed during a "no-operation" (NOP). Read and write operations can allow a smaller ramp rate, and a search rate can allow even smaller ramp rates.

FIG. 4 is figure showing how operational dependent approaches can affect resulting dummy activation of search engine sections. In FIG. 4, NOP operations can have a relatively large amount of ramping. In contrast, READ and WRITE operations can have a lower ramping.

Of course, which particular operations can allow for greater or lesser ramp rates can be dependent upon the CAM device utilized. Thus, the particular operations and weighting shown in FIGS. 3 and 4 should not be construed as limiting to the invention.

Figure 5A:
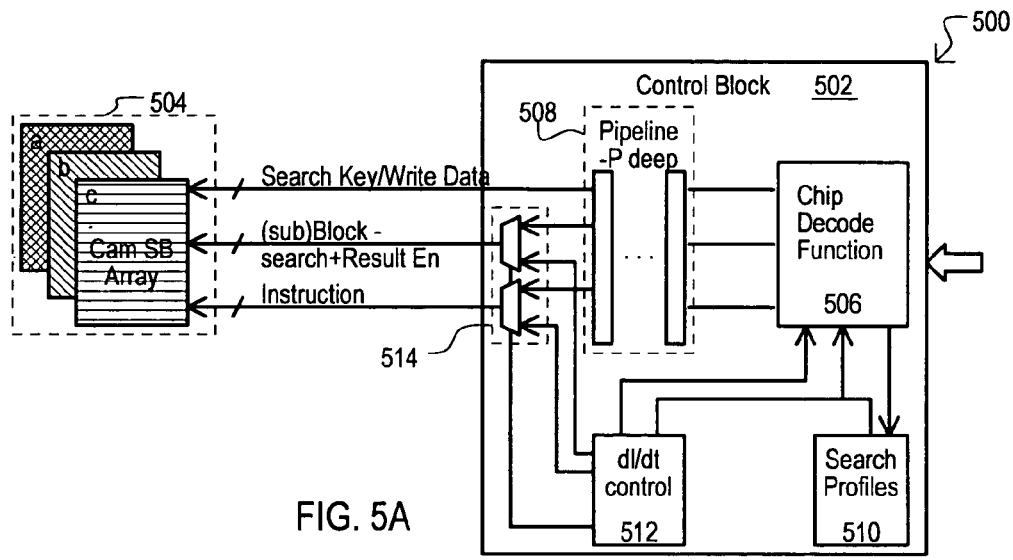
FIGS. 5A and 5B are block schematic diagrams showing a content addressable memory device search engine system according to one embodiment.
Figure 5B:
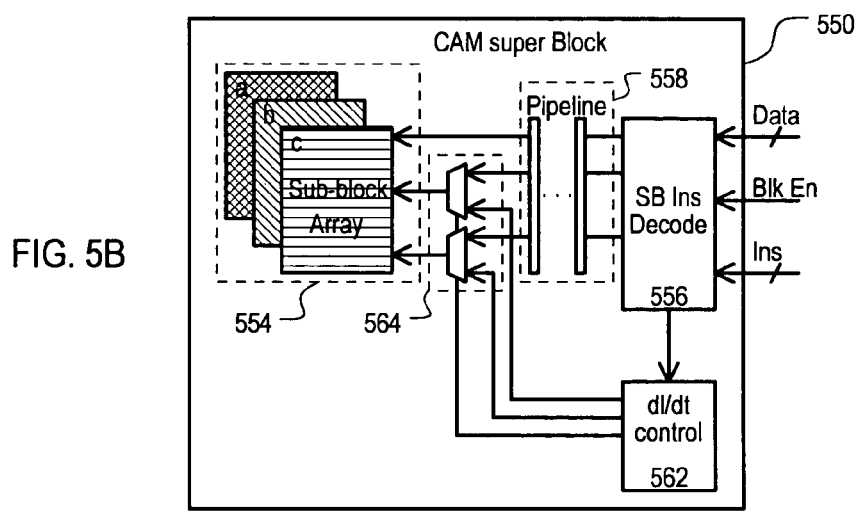

FIGS. 5A and 5B are block schematic diagrams of a search engine system according to one embodiment of the present invention. FIGS. 5A and 5B show a content addressable memory (CAM) device in which searchable entries are divided into sub-blocks, with sub-blocks being further divided into arrays. In one arrangement, result outputs from each sub-block and/or each array can be enabled in response to a corresponding result enable signal.

FIG. 5A shows a CAM device having current control at the device level. A CAM device 500 can include a control block 502 that can provide modified operation data (e.g., search key or write data), result enable data, and/or instruction data to super-blocks 504. In FIG. 5A, a control block 502 can include a command decode circuit 506, an instruction pipeline 508, a search profile store 510, and a current rate (dI/dt) control circuit 512.

A command decoder circuit 506 can receive externally received commands and data, and decode such commands to determine instruction type (e.g., search, write, read, learn) and blocks (arrays) targeted by each operation. According to such information, a command decoder circuit 506 can generate block enable signals for activating targeted superblocks or blocks within super-blocks. Operational data, block enable values, and instruction data can be forwarded down instruction pipeline 508.

Command decoder circuit 506 can also output a number of blocks accessed for a sequence of operations to a search profile store 510. A dI/dt control circuit 512 can access the sequence of searches (the "profile"), and, according to the techniques described above, generate modified block enable and instruction data. In addition, a dI/dt control circuit 512 can generate control signals for data multiplexers (MUXs) 514.

One of MUXs 514 can receive block enable data values from pipeline 508 and modified block enable values from dI/dt control circuit 512 as inputs. Another of MUXs 514 can receive instruction data from pipeline 508 and modified instruction data from dI/dt control circuit 512 as inputs. According to a control signal from dI/dt control circuit 512, data MUXs can selectively provide either non-modified block enable and instruction data, or modified block enable and instruction data. Such modified block enable and instruction data can result in dummy operations that can lower dI/dt changes.

It is understood that while data propagates down instruction pipeline 508, dI/dt control circuit 512 can generate instructions and block enable signals according to the methods shown above to present a modified profile having smaller dI/dt changes than the non-modified case.

FIG. 5B shows CAM device current control for a super-block, like one of those shown as 504 of FIG. 5A. A super-block 550 can include a super-block command decode circuit 556, an instruction pipeline 558, and a current rate (dI/dt) control circuit 562. A super-block command decoder circuit 556 can receive operation data, block enable values, and instruction data from a corresponding control circuit, such as control block 502 of FIG. 3A. According to such information, a super-block command decoder circuit 556 can generate block enable signals for activating targeted blocks (arrays) of the super-block. Such values can be forwarded down instruction pipeline 558. A dI/dt control circuit 562 can generate modified block enable and instruction data. In addition, a dI/dt control circuit 562 can generate a control signals for data multiplexers (MUXs) 564. According to a control signal from dI/dt control circuit 562, data MUXs 564 can selectively provide either non-modified block enable and instruction data, or modified block enable and instruction data to blocks 554 (arrays).

The above are but embodiments of the present invention, and could be subject to considerable modification to arrive at other embodiments.

Figure 6:
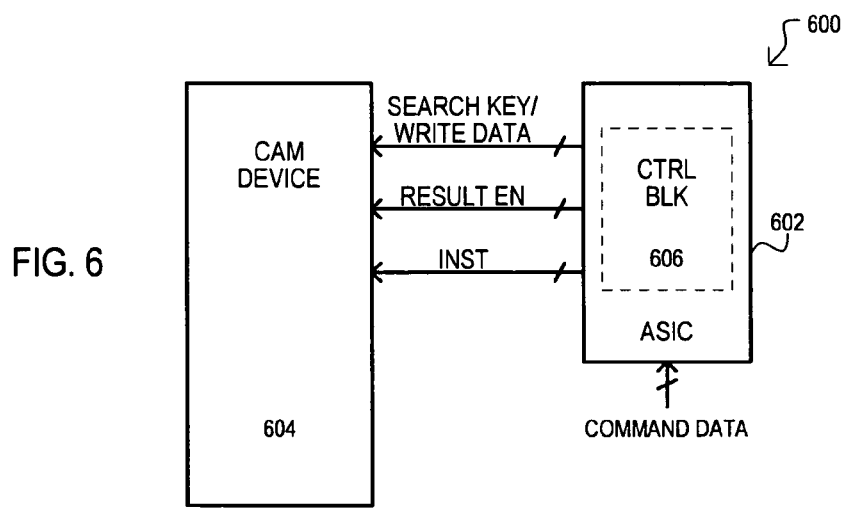
FIG. 6 is a block schematic diagram showing a search engine system according to another embodiment.
Figure 7:
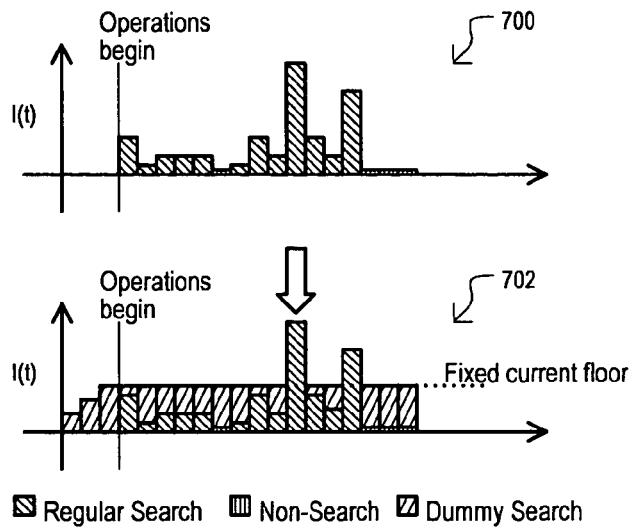
FIG. 7 shows two timing diagrams of a conventional method for limiting current rate changes.
Figure 8:
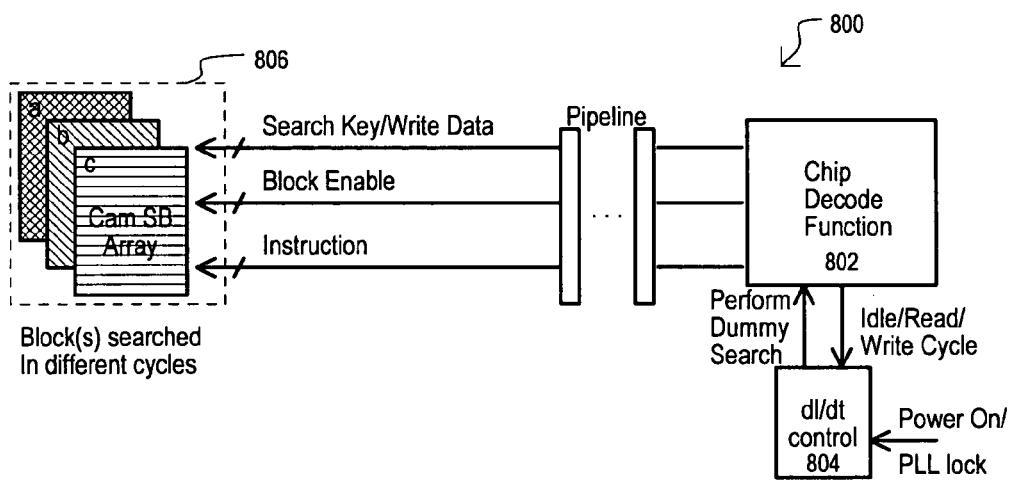
FIG. 8 is a block diagram of a conventional CAM device.

A second embodiment is shown in FIG. 6. FIG. 6 shows a search engine system 600 that includes a control integrated circuit 602 (in this case an application specific integrated circuit, ASIC) separate from a CAM integrated circuit 604. An ASIC 604 can include a control block 606, like that shown in FIG. 5A. Thus, an ASIC 604 can issue a sequence of commands to a CAM device based on sequence of operations. Such commands can selectively activate CAM devices, or sections within CAM devices according to the algorithmic approaches noted above. Advantageously, such an approach can be implemented using one or more standard CAM devices.

It is noted that an ASIC may advantageously have access to a deepest pipeline of incoming instructions, thus providing the greatest amount of look-ahead for implementing algorithmic control of dI/dt values.

It is also understood that the embodiments of the invention may be practiced in the absence of an element and or step not specifically disclosed. That is, an inventive feature of the invention can be elimination of an element.

The above embodiments have presented approaches that can limit dI/dt changes in CAM devices. Such approaches can provide a better response than conventional arrangements that present only a current floor. Further, operations (e.g., searches) can be executed with no additional latency, as can the case for approaches that split a single search over multiple cycles.

While the various aspects of the particular embodiments set forth herein have been described in detail, the present invention could be subject to various changes, substitutions, and alterations without departing from the spirit and scope of the invention.

What is claimed is:

1. A search engine system, comprising:
   at least one command decoder having search engine command input;
   at least one pipeline for propagating command data from the command decoder from a pipeline input to a pipeline output, the command data being directed to targeted portions of a plurality of searchable entries; and
   at least one current control circuit that issues dummy command data that bypasses the pipeline and activates non-targeted portions of the searchable entries.

2. The search engine system of claim 1, wherein:
   the search engine system includes a control integrated circuit having the at least one command decoder, at least one pipeline and at least one current control circuit formed therein, and not having the searchable entries formed therein.

3. The search engine system of claim 2, further including:
at least one content addressable memory (CAM) device integrated circuit coupled to the control integrated circuit, the at least one CAM device integrated circuit including the searchable entries.

4. The search engine system of claim 1, wherein:
the search engine system includes at least one content addressable memory (CAM) device integrated circuit having a plurality of super-blocks, each super-block including a plurality of separately searchable sub-blocks, each sub-block including a plurality of CAM entries, wherein
each super-block includes a corresponding command decoder, pipeline and current control circuit that issues dummy commands to the sub-blocks of the super-block.

5. The search engine system of claim 1, wherein:
search engine system includes
at least one content addressable memory (CAM) device integrated circuit having a plurality of super-blocks, each super-block including a plurality of separately searchable sub-blocks, each sub-block including a plurality of CAM entries, wherein
the at least one CAM device includes, for each super-block, a corresponding command decoder, pipeline and current control circuit that issues dummy commands to the super-block.

6. The search engine system of claim 1, further including:
a data switching circuit that couples command data from the at least one pipeline to the searchable entries and dummy command data from the at least one current control circuit to the searchable entries.

7. The search engine system of claim 1, further including:
a profile store coupled to the at least one current control circuit stores the portions of the searchable entries accessed by each command for a sequence of commands.

8. A search engine system, comprising:
a plurality of searchable entries divided into separately searchable portions, each searchable portion having a result output enabled in response to a corresponding result enable signal;
at least one pipelined instruction path including at least a pipeline section for sequentially shifting command data therethrough; and
at least one bypass instruction path in parallel with the at least one instruction path that bypasses the pipeline section and includes a result enable signal for each searchable portion.

9. The search engine system of claim 8, wherein:
the search engine system includes a control integrated circuit having the at least one pipelined instruction path and at least one bypass instruction path formed therein, and not having the searchable entries formed therein.

10. The search engine system of claim 8, wherein:
the search engine system includes at least one content addressable memory (CAM) device integrated circuit having a plurality of super-blocks, each super-block including a plurality of separately searchable sub-blocks, each sub-block including a plurality of CAM entries, wherein
each super-block includes a corresponding pipelined instruction path and corresponding bypass instruction path that provides result enable signals to the sub-blocks of the super-block.

11. The search engine system of claim 8, wherein:
the search engine system includes
at least one content addressable memory (CAM) device integrated circuit having a plurality of super-blocks, each super-block including a plurality of separately searchable sub-blocks, each sub-block including a plurality of CAM entries, wherein
the at least one CAM device includes, for each super-block, a pipelined instruction path and corresponding bypass instruction path that provides result enable signals to the super-block.

12. The search engine system of claim 8, further including:
a switching circuit that selectively couples output data from the at least one pipelined instruction path and at least one bypass instruction path to the plurality of searchable entries.

13. The search engine system of claim 12, wherein:
the output data includes instruction data that indicates a type of operation to be executed in targeted searchable portions.

14. The search engine system of claim 12, wherein:
the output data includes result enable signals for the searchable portions.

15. A method of controlling current in a search engine system, comprising the steps of:
receiving a profile that indicates a sequence of particular search engine commands and a number of activated blocks for each search engine command;
determining a maximum number and minimum number of blocks that are activated for all of the search engine commands of the profile;
selectively increasing the current drawn in response to each search engine command according to the maximum and minimum number of blocks that are activated in the profile to reduce the current rate changes between search engine commands as compared to execution of the search engine commands without the increase of current drawn.

16. The method of claim 15, further including:
determining a first current consumption value for a search engine operation occurring on a given operational cycle;
providing a ramped current consumption profile leading up to the given operational cycle by increasing or decreasing the current consumption in successively higher amounts in operational cycles prior the given operation cycle; and
providing a ramped current consumption profile following the given operational cycle by increasing or decreasing the current consumption in successively higher amounts in operational cycles subsequent to the given operation cycle.

17. The method of claim 16, wherein:
the ramped current consumption profile leading up to the given operational cycle includes an essentially linear profile.

18. The method of claim 16, wherein:
the ramped current consumption profile following the given operational cycle includes an essentially non-linear profile.

19. The method of claim 18, wherein:
the essentially non-linear profile provides for greater current consumption rate increases in certain operations, and slower current consumption rate increases in certain other operation.

20. The method of claim 15, further including:
increasing the current drawn for search engine command to maintain a minimum current draw if the drawn by the search engine command is determined to be less than a minimum current draw value.

* * * * *